Feb. 25, 1964 J. L. SANBORN 3,122,653

SUPERCONDUCTIVE SHIFT REGISTER

Filed June 29, 1961 2 Sheets-Sheet 1

INVENTOR
JERE L. SANBORN

BY

ATTORNEY

Feb. 25, 1964 J. L. SANBORN 3,122,653

SUPERCONDUCTIVE SHIFT REGISTER

Filed June 29, 1961 2 Sheets-Sheet 2

United States Patent Office 3,122,653
Patented Feb. 25, 1964

3,122,653
SUPERCONDUCTIVE SHIFT REGISTER

Jere L. Sanborn, Poughkeepsie, N.Y., assignor to International Business Machines Corporation, New York, N.Y., a corporation of New York Filed June 29, 1961, Ser. No. 120,676
8 Claims. (Cl. 307—88.5)

This invention relates to superconductive circuits and more particularly to improved superconductive logical switching circuits.

The phenomenon of superconductivity, that is, the absence of electrical resistivity exhibited by certain materials below predetermined temperatures, has been employed in various logical circuits as shown by way of example in U.S. Patent 2,832,897, issued April 29, 1958, to D. A. Buck. As described therein, the basic superconductive building block, known as a cryotron, comprises a central wire, or gate conductor, about which is wound a single layer coil, or control conductor. The cryotron is then operated at a superconductive temperature such that the gate conductor is normally superconducting. Current flow of at least a predetermined magnitude through the control conductor is thereafter effective to generate a magnetic field which, applied to the gate conductor, quenches superconductivity therein so that the gate conductor exhibits normal resistance at the operating superconductive temperature. Further, the control conductor is generally fabricated of a superconductive material having a higher value of critical field than the gate conductor, that is the value of magnetic field which quenches superconductivity, in order that the control conductor remains superconducting for all values of magnetic fields encountered in the operating circuit. Through the interconnection of the gate and control conductors of various cryotrons, amplifiers, oscillators, and logical circuits have been designed which feature low cost, small size and a high degree of reliability.

A basic circuit disclosed in the above referenced patent to Buck is the superconductive bistable trigger or flip-flop stage. The trigger, as shown, consists essentially of a pair of superconductive paths electrically connected in parallel. The first path includes a gate conductor of a first cryotron and a control conductor of a second cryotron, and the second path includes the gate conductor of the second cryotron and the control conductor of the first cryotron. Current flow through the first path is indicative that the trigger is in the first stable state and current flow through the second path is indicative that the trigger is in the second stable state. Current applied to these parallel paths is caused to flow through only one of these paths, for the reason that current flow through one path destroys superconductivity in the other and it is well known that current supplied to both a superconducting and a resistive path connected in parallel, flows entirely through the superconducting path. Thereafter, current can be directed to one or the other paths by momentarily causing the superconducting path to become resistive to initiate a current shift between the paths which cumulatively continues until the original resistive path becomes superconducting and the circuit thereafter maintains the original superconducting path, in which the switch initiating resistance was introduced, in the resistive state until such time as the next switching action is desired. A more complete description is, of course, found in the Buck patent to which reference should be made for detailed information. Further, improved cryotrons, formed of thin films insulated one from another, are shown in copending application Serial No. 625,512, filed November 30, 1956, on behalf of Richard L. Garwin and assigned to the assignee of this invention. These thin film cryotrons exhibit higher switching speeds than the wire wound cryotrons and are preferably employed in the embodiments of this invention.

An improved superconductive trigger circuit is shown in U.S. Patent 2,966,598, issued December 27, 1960, to J. B. Mackay. As there shown, current applied to an input terminal is directed by means of a novel current steering circuit to alter the state of the trigger. This latter class of trigger circuits differs from the Buck class in that first and second input terminals, isolated one from the other, are not required to set the trigger to the first and second stable states. Rather, a common input terminal is employed, and the state of the trigger determines the path through which the input set current flows.

According to this invention, however, there is provided a further class of superconductive logical circuits wherein the applied input signals are directed through one and only one circuit path. By way of example, in the trigger embodiment of the invention, input set pulses are directed through a single defined path irrespective of the state of the trigger, and current flow through this path is effective to switch trigger to its other state. This feature is accomplished in this embodiment by employing four multiple control cryotrons. A multiple control cryotron, as defined in this specification, is an in-line or crossed cryotron with two or more superimposed control conductors, the vector sum of the magnetic fields generated by current flow through the several control conductors determining the state, superconducting or normal, of the associated gate conductor. Further, as employed in this specification a multiple control in-line cryotron is characterized by the several control conductors being orientated longitudinally parallel with the gate conductor and arranged in vertical planes coincident therewith, to ensure that the entire length of the gate conductor is resistive when the critical field is exceeded. A multiple control crossed cryotron likewise is characterized in that the several control conductors are arranged in parallel vertical planes with each control conductor oriented perpendicular to the longitudinal dimension of the gate conductor.

Continuing with the trigger embodiment of the invention, the four multiple control cryotrons are arranged in two parallel paths, each of which is normally superconducting. The first path, representative of a binary 1, by way of example, includes the gate conductor of a first cryotron and a control conductor of a second cryotron. Similarly the second path, representative of a binary 0, includes the gate conductor of a third cryotron and a control conductor of a fourth cryotron. The main trigger current flowing through either of these paths is indicative of the state thereof.

A second independent pair of parallel superconductive paths are also provided by the same four cryotrons, through which an auxiliary trigger, or setting, current flows, as more particularly described hereinafter. The first of these second pair of independent parallel paths includes a control conductor of the first cryotron and the gate conductor of the fourth cryotron, and the second of these paths includes the gate conductor of the second cryotron and a control conductor of the third cryotron. The auxiliary trigger current flowing through a particular one of these paths is effective, together with the input trigger pulse, to alter the state of the trigger and, further, is shifted into the other of these paths as a result of the termination of the input trigger pulse. Finally, for proper circuit operation, a bias current, that is a current whose magnitude is constant independent of the state of the trigger as well as the presence or absence of an input trigger pulse, is applied to a control conductor of both the second and fourth cryotrons.

A particular advantage of the invention resides in superconductive logical circuits which exhibit higher switching speeds than hitherto available. This results from the fact that the input signal is applied through a single superconducting path, which is defined independent of the state of the circuit, and further, the removal of the input signal conditions the circuit, during what is known as "circuit dead time," to be responsive to the next applied input pulse. Additionally, this design philosophy is utilized in a second embodiment of the invention, as illustrated by a shift register, which will be more completely understood as the description proceeds.

It is an object of the invention to provide improved superconductive logical circuits.

Another object of the invention is to provide an improved superconductive trigger circuit.

Still another object of the invention is to provide a cryogenic trigger circuit employing only a single superconducting input signal path which is independent of the state of the trigger.

Yet another object of the invention is to provide a cryogenic trigger circuit which exhibits higher switching speeds.

A further object of the invention is to provide improved superconductive logical circuits wherein the application of logical signals thereto alters the state of the circuits and the termination of the signals is thereafter effective to condition the circuits for receipt of further logical signals.

A related object of the invention is to provide novel superconductive circuits employing multiple control cryotrons.

Yet another object of the invention is to provide an improved superconductive shift register.

Still another object of the invention is to provide an improved cryogenic trigger circuit wherein current is established in a first or second parallel path representative of a first or second stable state in response to an input trigger pulse together with an auxiliary current flow through an additional pair of first and second parallel current paths wherein the auxiliary current flow is further controlled by the termination of the trigger pulse.

The foregoing and other objects, features and advantages of the invention will be apparent from the following more particular description of preferred embodiments of the invention, as illustrated in the accompanying drawings.

Figure 1:
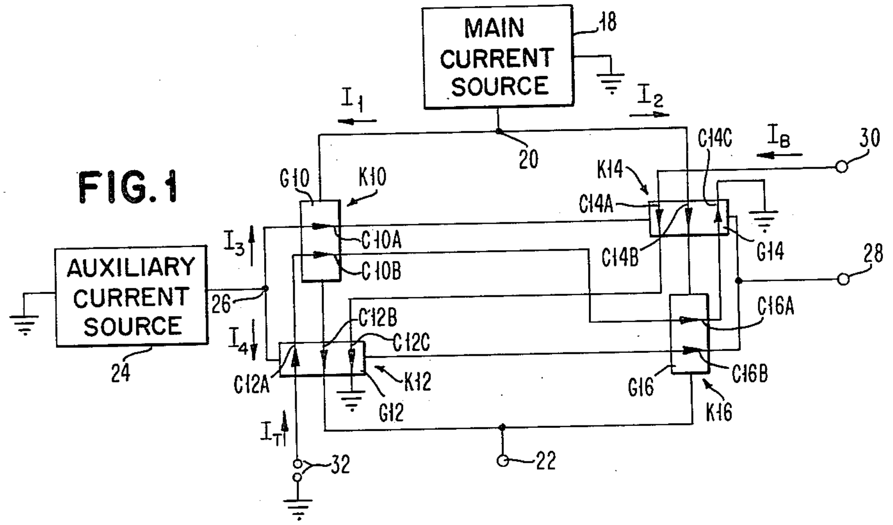
FIG. 1 is a schematic diagram of the superconductive trigger embodiment of the invention.

Referring now to the drawings, FIG. 1 is a schematic diagram of the trigger embodiment of the invention. As shown in this figure, the circuit includes four multiple control cryotrons indicated as K10, K12, K14 and K16. Cryotron K10 includes a gate conductor G10 and a pair of control conductors C10A and C10B. Cryotron K16 is similar to cryotron K10 and includes a gate conductor G16 and a pair of control conductors C16A and C16B. Cryotron K12 includes a gate conductor G12 and three control conductors indicated as C12A, C12B, and C12C. In a similar fashion, cryotron K14 includes a gate conductor G14 and three control conductors indicated as C14A, C14B and C14C.

As briefly stated above, the state of the gate conductor, either superconducting or normal, in a multiple control cryotron is determined by the vector sum of the magnetic fields applied thereto as a result of current flow through the plurality of control conductors associated therewith. However, for reasons of clarity, the circuits will be described in terms of the vector sum of the magnitude of current flow through the various control conductors, it being understood that a unit value of current generates a unit value of magnetic field and it is the magnetic field itself which controls the state of the gate conductor. Each of the cryotrons shown in FIG. 1 are selected such that a unit flow of current through the gate conductor and a vector sum of control currents less than 1.5 does not produce resistance in the gate conductor. Conversely, when the vector sum of the control currents is equal to two or more units of current, the gate conductor is resistive even with 0 current flowing therethrough. By way of example, one unit of current flow through control conductor C10A in the direction indicated in FIG. 1 is, of itself, not sufficient to cause gate conductor G10 to switch to the resistive state at the operating superconductive temperature. The further addition of one unit of current through control conductor C10B in addition to the current flow through control conductor C10A, in the direction shown, vectorially adds to two units of current and this magnitude is sufficient to switch gate conductor G10 to the resistive state. Continuing, with reference now to cryotron K12, one unit of current flow through control conductor C12B, in the direction shown, is insufficient to quench superconductivity in gate conductor G12. The simultaneous addition of one unit of current flow through control conductor C12C, however, sums vectorially to two units of current, which is sufficient to switch gate conductor G12 to the resistive state. At this time, one unit of current flow through control conductor C12A, in a direction as shown which is opposite to the direction of current flow through C12C and C12B reduces the net effective control current to one unit thereby permitting gas conductor G12 to return to the superconducting state. Thus, for the cryotron characteristics, that have been selected by way of example, a vector sum of 0 or one unit of control current, is ineffective to switch the associated gate conductor to the resistive state, while two or more units of effective control current switches the associated gate conductor to the resistive state. It should be understood at this time, however, that it is not necessary that each of the cryotrons exhibit the same operating characteristics, since, by adjusting the control conductor characterizing various combinations of characteristics could also be selected, as desired, the choice of identical characteristics in the illustrative examples, being made solely to aid in the understanding of the various embodiments of the invention.

Referring again now to FIG. 1, the main trigger current from a constant current source 18, which may be by way of example a relatively high value of resistance in series with a battery, is directed to a terminal 20 and thence through one of a pair of parallel paths to a terminal 22. Terminal 22 is connected to a similar trigger circuit or, alternatively, to ground. The first of these parallel paths, representative, by way of example of a binary 1 or the first stable state of the circuit, includes gate conductor G10 of cryotron K10 and control conductor C12B of cryotron K12. In a similar manner, the second of the parallel paths, representative of a binary 0 or the second stable state of the circuit, includes control conductor C14B of cryotron K14 and gate conductor G16 of cryotron K16. Further, an auxiliary current source, indicated as 24, is also connected to an additional pair of parallel paths. As will be understood as the discussion proceeds, the current from source 24 together with the input trigger pulse is effective to change the state of the circuit. Current from source 24 flows first to a junction 26 and thence through one or the other of the parallel paths to a terminal 28. Again, terminal 28 may be connected to either another similar circuit or to ground in like manner as terminal 22. The first of these additional parallel paths includes control conductor C10A of cryotron K10 and gate conductor G14 of cryotron K14. The second of these additional parallel paths includes gate conductor G12 of cryotron K12 and control conductor C16B of cryotron K16. Additionally, a bias current having a magnitude of one current unit is supplied to a terminal 30 and thence through control conductor C14A of cryotron K14 and control C12C of cryotron K12 to ground. Next, to complete the circuit, trigger pulses are conveyed through a singly defined path which includes one control conductor of each of the four cryotrons of the circuit. Specifically, trigger pulses are applied to a pair of terminals 32 and directed through control conductor C12A of cryotron G12, control conductor C10B of cryotron K10, control conductor C16A of cryotron K16, and control conductor C14C of cryotron K14 to ground. Each of the current sources 24 and 18 as well as the magnitude of the trigger pulses supplied to terminals 32, are adjusted to provide one unit of current, the same as the magnitude of the bias current supplied to terminal 30, for ease in understanding the operation of the circuit. However, it should be noted that these four current values can be adjusted as desired with corresponding modifications in the operating characteristics of the cryotrons.

Figure 2A:
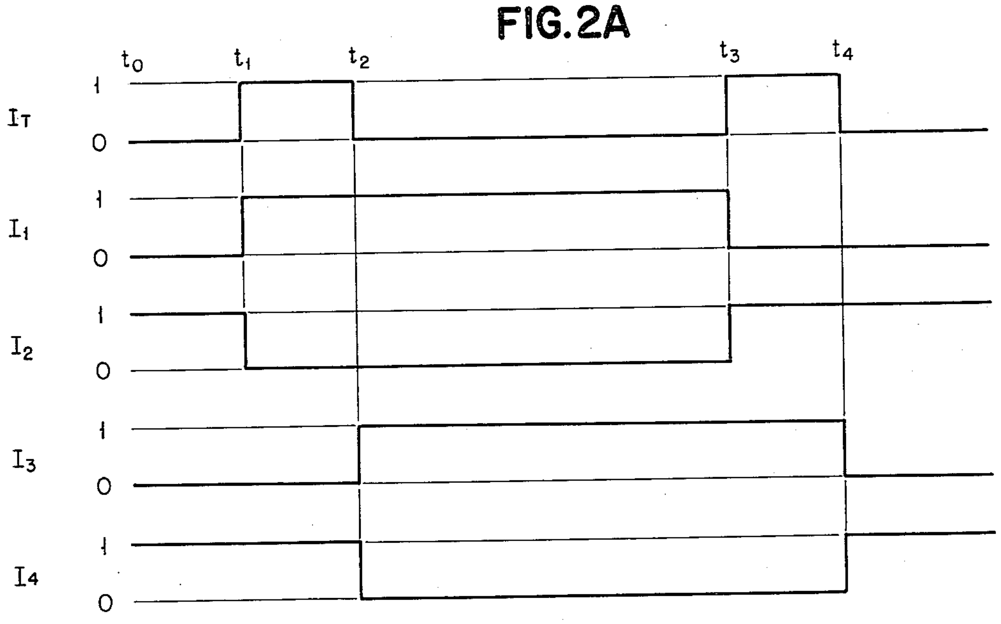
FIG. 2A represents current waveforms developed in the circuit of FIG. 1.

In the following description of the operation of the circuit of FIG. 1, reference should be had to the idealized waveform diagrams of FIG. 2A and FIG. 2B as an aid in understanding the operation of the circuit. At time $t_0$, the trigger circuit is shown to be in the second stable state with the current from source 18 flowing in the second parallel path through control conductor C14B and gate conductor G16. This current is indicated as $I_2$ in the figures. At time $t_0$, no current from source 18 flows through the first parallel path representative of the binary 1 including gate G10 and control conductor G12B and this current, having at this time a value of 0, is indicated in the drawings as $I_1$. In a similar fashion, the current from source 24, at time $t_0$, is caused to flow through gate conductor G12 and control conductor C16B indicated in FIG. 1 as current path $I_4$. This results since the path parallel therewith, labelled $I_3$, is resistive at time $t_0$. Bias current $I_B$ flowing through control conductor C14A and current $I_2$ flowing through control conductor C14B of cryotron K14, each conduct one unit of current in the same direction, providing a vector sum of two units of current. This vector sum is sufficient to switch gate conductor G14 to the resistive state. However, the control conductors of cryotron K12 are energized by only one unit of current, due to current $I_B$ flowing through control conductor C12C, allowing gate conductor G12 of current path $I_4$ to remain in the superconducting state. Of the two parallel paths connected to junction 26, one of which is resistive, the other of which superconducting, the current from source 24, arriving at junction 26, flows completely through the superconducting path. Therefore, at time $t_0$, current $I_4$ has a magnitude of one and $I_3$ is equal to zero, as shown in FIG. 2A.

Next, at time $t_1$, trigger current $I_T$, of a magnitude equal to one unit of current, is applied to terminals 32. This current, flowing through control conductor C12A of cryotron K12, effectively cancels the field produced by the one unit of current flow through control conductor C12C, providing a vector current sum of 0 and, correspondingly, a net magnetic field of 0, thereby allowing gate conductor G12 to remain in the superconducting state. Additionally, current $I_T$ flows through control conductor C10B. However, at this time current $I_3$ flowing through control conductor C10A has a value of 0 resulting in a vector sum of current of one unit being applied to the control conductors of cryotron K10, permitting gate G10 of cryotron K10 to remain superconducting. Next, current $I_T$ flows through control conductor C16A of cryotron K16. At this time, current $I_4$ is also flowing through control conductor C16B of cryotron K16, resulting in the vector sum of current through the control conductors of cryotron K16 attaining a value of two units of current. This value is sufficient to quench superconductivity in gate G16 of cryotron K16. Resistive gate conductor G16 causes current $I_2$ to begin to decrease to 0 due to the main current shifting from the binary 0 path into the binary 1 path. The decrease in the value of current $I_2$ is, of necessity, followed by an increase in the value of current $I_1$, until all of the current from source 18 is flowing in the binary 1 path and current $I_1$ attains a value of one unit of current. Continuing, current $I_T$ also flows through control conductor C14C of cryotron K14. Previously to time $t_1$, gate conductor G14 of cryotron K14 was in the resistive state. However, as a result of the application of current $I_T$ at time $t_1$, gate conductor G14 switches to the superconducting state. This results from the fact that current $I_T$ flows in the direction opposite to current $I_B$ in control conductor C14A and moreover, current $I_2$ is reduced to a value of 0. It should be noted at this time, that the value of current $I_1$ has increased to one unit value of current which flows through control conductor C12B of cryotron K12. This current flows in the same direction as bias current $I_B$ flows through control conductor C12C. However, during the time interval $t_1$–$t_2$, current $I_T$ flowing through control conductor C12A is in a direction opposite to each of currents $I_1$ and $I_B$ in the other control conductors of cryotron K12. Thus, the vector sum of the currents in the control conductors of cryotron K12 obtains a value of one unit of current and gate conductor G12 remains superconducting, permitting current $I_4$ to continue to flow through its established path. Therefore, it is seen that the application of trigger current $I_T$ at time $t_1$ is effective to alter the state of the trigger by shifting the main memory current from one of the main parallel paths to the other, and is ineffective to alter the established current flow from auxiliary current source 24. Specifically, at time $t_1$, the application of trigger current $I_T$ ensures that the gate conductors of cryotrons K12 and K14 become or remain superconducting and current $I_T$, in conjunction with current $I_4$, is effective to shift the main memory current from the binary 0 path to the binary 1 path.

The termination of trigger current $I_T$, at time $t_2$, is effective to initiate a supplemental switching action, which conditions the trigger circuit to change states upon the application of the next trigger pulse. This occurs at time $t_2$, since gate conductor G12 of cryotron K12 switches resistive through the combined action of current $I_1$ flowing through gate conductor C12B and bias current $I_B$ flowing through gate conductor C12C. These currents flowing in the same direction, as shown, produce a vector sum of current of two units which quenches superconductivity in gate conductor G12. At this time, the current path provided for current $I_3$ is superconducting since gate G14 of cryotron K14 remains superconducting as a result of only a single unit of current being applied to the control conductors thereof through the action of bias current $I_B$ flowing through control conductor C14A, the value of $I_2$ flowing through control conductor C14B being 0 at this time. Therefore, the resistive gate conductor G12 is effective to shift the current from auxiliary current source 24 arriving at junction 26 from the $I_4$ path to the $I_3$ path as particularly shown in the waveforms of FIG. 2A. Thus upon the termination of the trigger pulse, current $I_3$ obtains a value of one unit of current and current $I_4$ is decreased to 0.

Thereafter, at time $t_3$, the application of a second trigger pulse is effective to return the main memory current to the binary 0 path and, in a similar fashion as hereinbefore described, the termination of the second trigger pulse at time $t_4$ is effective to shift the auxiliary memory current from the $I_3$ path to the $I_4$ path to condition the circuit for the next occurring trigger pulse, as is next described. The application of the second trigger pulse at time $t_3$, is effective to switch or maintain gate conductors G12 and G14 of cryotrons K12 and K14, respectively, in the superconducting state so as not to disturb the flow of the auxiliary memory current from source 24. Particularly, with respect to cryotron K14, the trigger current flowing through control conductor C14C opposes the bias current $I_B$ flowing through control conductor C14A, resulting in a vector sum of the control conductor currents being 0. In a similar fashion with respect to cryotron K12, although bias current $I_B$ flowing through control conductor C12C and current $I_1$ flowing through control conductor C12B tends to produce a vector sum of two units of current, trigger current $I_T$ flowing through control conductor C12A is effective to reduce the vector sum of current applied to gate conductor G12 to one unit of current, allowing this gate conductor to again become superconducting. The application of trigger current $I_T$ to control conductor C16A is ineffective to switch gate conductor G16 to the resistive state since at this time current $I_4$ flowing through control conductor C16B has a value of 0. However, with respect to cryotron K10, the trigger current $I_T$ flowing through control conductor C10B together with current $I_3$ flowing through control conductor C10A is effective to produce a vector sum of two units of current and thereby switch gate conductor G10 of cryotron K10 to the resistive state. The introduction of the resistive gate conductor G10 in the path traversed by current $I_1$ is effective to initiate a shifting of the main circuit current delivered by source 18 from the resistive $I_1$ path to the superconducting $I_2$ path. In this manner, the magnitude of $I_1$ is reduced to 0 and that of $I_2$ increased to one unit of current. Again these waveforms are indicated in FIG. 2A. It is therefore seen that, during the time interval $t_3$ to $t_4$, when the second trigger pulse is applied, current $I_3$ remains established in its superconducting path and the main memory current is shifted out of the binary 1 path and into the binary 0 path. Thus, the circuit is changed from the first to the second stable state. Again, the termination of the trigger current at time $t_4$ is effective to produce a shift in the auxiliary memory current to condition the circuit to be responsive to the next of the applied input trigger pulses. This occurs at time $t_4$ since, upon the termination of $I_T$, current $I_B$ flowing through control C14A of cryotron K14 together with current $I_2$, now having a value of 1, flowing through control conductor C14B together produce a vector sum of two units of current to quench superconductivity in gate conductor G14. This resistance introduced in the $I_3$ path is thereupon effective to direct the auxiliary memory current from source 24 into the $I_4$ path, which is now superconducting, thereby decreasing the value of $I_3$ to 0 and increasing the value of $I_4$ to 1. At this time, the circuit has been returned to the initial condition as indicated by time $t_0$, and further application of additional trigger pulses produces a corresponding sequence of operations, with the circuit alternately being switched between the first and second stable states.

It should now be apparent that the application of a trigger pulse through a particular singularly defined path is effective to alter the state of the circuit in conjunction with the auxiliary memory current flowing in either path $I_3$ or $I_4$, and, further, the auxiliary memory current is selectively directed into a particular one of these paths upon the termination of the trigger pulse which is dependent solely upon the state of the trigger at the time the trigger is terminated. Note should also be made of the fact that terminal 22, whereat the main memory current is recombined, could also be connected directly to terminal 26 thereby eliminating the auxiliary memory current source 24, without altering the operation of the circuit nor subtracting from the speed thereof. Further, additional note should be made, that, as a result of the fact that the trigger pulses are applied to a particular terminal, and, further, that the trigger pulse supplied is directed to a single path independent of the state of the circuit, higher operating speeds are obtainable over circuits wherein the trigger pulses must first be selectively directed to a particular one of a pair of input terminals or wherein the input trigger pulses must first traverse a particular path determined and controlled by the state of the trigger.

Figure 2B:
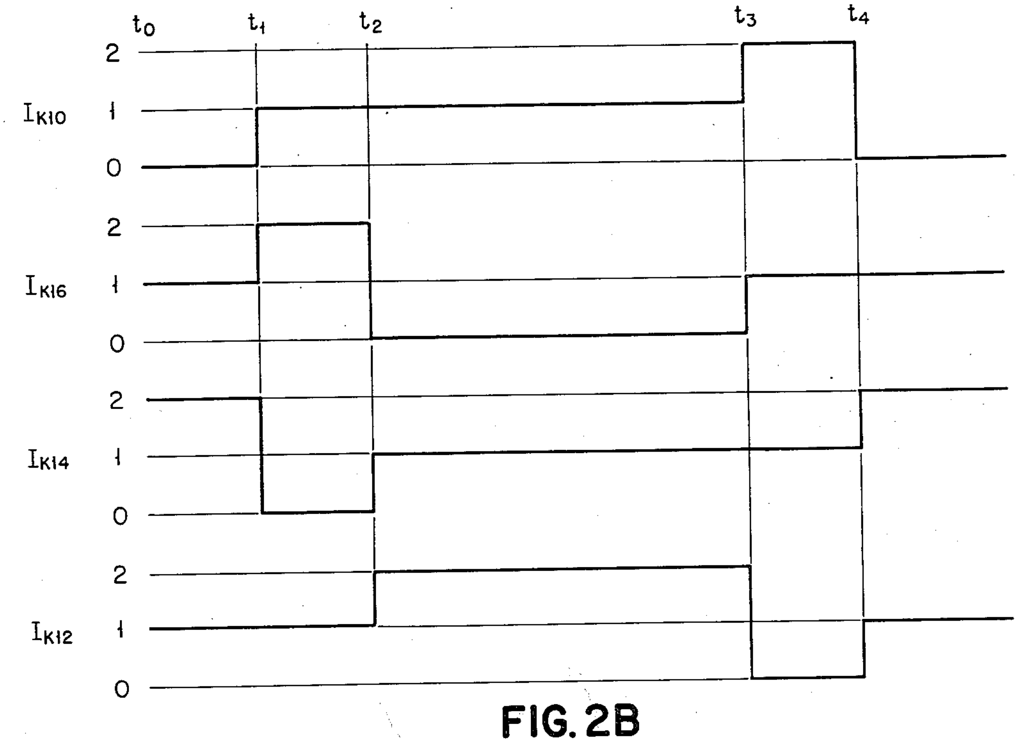
FIG. 2B represents the magnitude of the magnetic fields developed in the cryotrons of FIG. 1.

As a further aid in understanding the operation of the circuit of FIG. 1 reference should now be had to FIG. 2B wherein the vector sum of the control currents applied to each of the four cryotrons of the circuit are shown during the same time intervals as indicated in FIG. 2A. Thus, it is seen that during the interval between $t_0$ and $t_1$, the vector sum of the currents applied to cryotron K10 is 0, the vector sum of the currents applied to cryotron K16 is 1, the vector sum of the currents applied to cryotron K14 is 2, and the vector sum of the currents applied to cryotron K12 is 1. It is thus clearly seen that, during the interval $t_0$ to $t_1$, that is prior to the application of a trigger pulse, the gate conductor G14 of cryotron K14 is the only gate conductor of the circuit which is resistive. Next, during the time interval $t_1$ to $t_2$, it is seen that the vector sum of the control current of cryotron K16 has been increased to two units of current. Thus, during this time interval gate conductor G16 is the only gate conductor resistive. In a similar fashion it can be seen that during the interval $t_2$ to $t_3$, that is before the application of the next trigger pulse, gate conductor G12 of cryotron K12 is again the sole resistive cryotron and thereafter during the application of the second trigger pulse, that is during time interval $t_3$ to $t_4$, gate conductor G10 of cryotron K10 is the only resistive gate conductor in the circuit. In this fashion, during each of the specified time intervals, which cover a complete cycle of operation, one and only one gate conductor is resistive, and, further, during the application of a trigger pulse either gate conductor G10 or gate conductor G16 is switched resistive to switch the circuit from one stable state to another, and during the interval between the trigger pulses the gate conductor G12 or G14 is switched resistive to establish the auxiliary memory current in one of the $I_3$, $I_4$ paths, to condition the circuit to be responsive to the next applied trigger pulse.

It should be pointed out that in the circuit of FIG. 1, there is shown neither a pair of readout cryotrons, nor a reset cryotron to establish a particular state of the circuit when power is initially applied thereto. However, each of these circuits are well known in the art and the added complexity necessary to illustrate these components is deemed to detract from the invention as shown. By way of example, an elementary pair of sense cryotrons could be incorporated, as shown by either Buck or Mackay, by including a control conductor of a cryotron in each of the parallel paths representative of the binary state. The gate conductors of these sense cryotrons are then connected in parallel with a sense current source. Current flow through the control conductor of one of the sense cryotrons causes the corresponding gate to become resistive thus directing the sense current to flow through the other superconducting gate conductor to indicate the state of the trigger. In a similar manner, many of numerous reset devices could also be employed as required, as, by way of example, the reset scheme illustrated next in FIG. 3.

Figure 3:
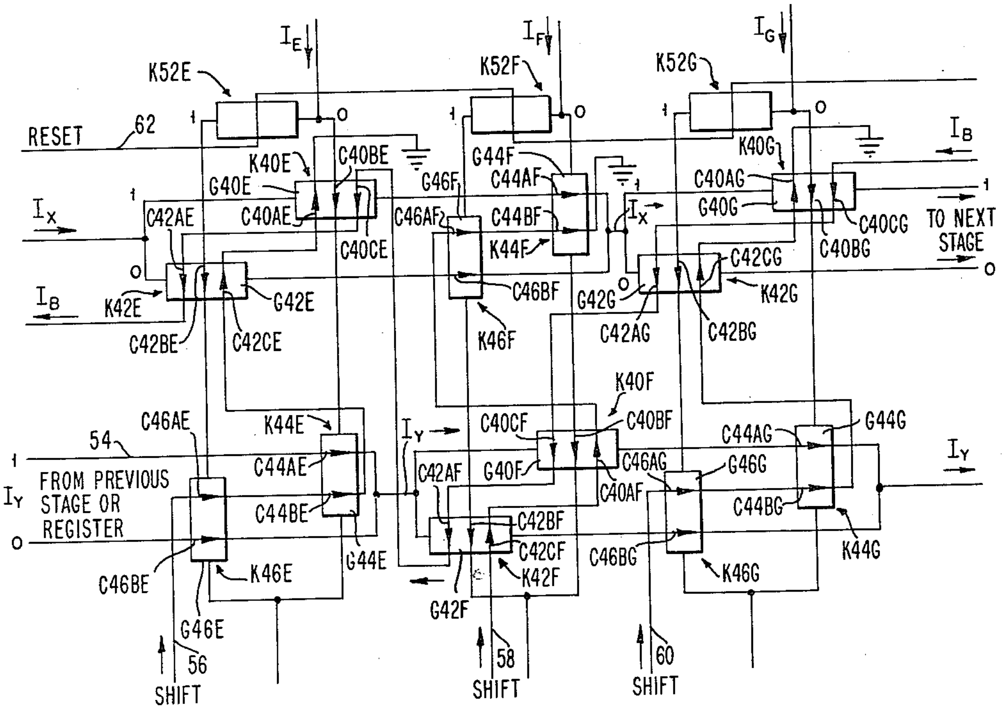
FIG. 3 is a schematic diagram of the superconductive shift register embodiment of the invention.

Referring now to FIG. 3, there is illustrated a preferred shift register embodiment of the invention. As illustrated therein, only three stages are shown, it being understood that a greater or lesser number of stages could be employed as required. Each of the stages, indicated as stage E, stage F, and stage G in the drawing, are identical. However, for compactness of the drawing stage F is shown as, essentially, an inversion of either stage E or stage G. As shown, each of the stages include four cryotrons indicated as K40, K42, K44, and K46, the particular cryotron in each stage being distinguished from the other cryotrons of the same reference number by having the stage designation in subscript attached thereto. Thus cryotron 40 in stage E is indicated as cryotron K40E, cryotron K40 in stage F is indicated as cryotron K40F, cryotron K40 in stage G is indicated as cryotron K40G, etc. Further, the gate conductors of the various cryotrons are additionally identified in a similar manner as in FIG. 1. Thus the gate conductor of cryotron K40E is identified as G40E and the gate conductor of cryotron K40F is indicated as G40F. However, because of the multiple control cryotrons employed, the various control conductors of each cryotron are first differentiated with the subscript A, B, or C, as required, to which is thereafter added the stage identification. With reference to cryotron K40E, it should be noted that the control conductors are identified as C40AE to indicate the first control conductor of cryotron K40E, as control conductor C40BE to indicate the second control conductor, and finally as control conductor C40CE to indicate the third control conductor thereof. This system of assigning reference numerals has been applied consistently throughout the remainder of the schematic diagram illustrated in FIG. 3.

In the shift register shown in the figure, each stage is supplied with a main current source indicated as $I_E$, $I_F$, and $I_G$ applied to stage E, stage F, and stage G, respectively. This current flows through a first path, which, by way of example in stage E, includes control conductor C40BE and gate conductor G44E, is indicative that a binary 0 is stored in the stage, or this current selectively flows through a second path in parallel therewith indicative of a binary 1 which, again by way of example in stage E, includes the gate conductor G52E of a cryotron K52E, control conductor C42BE, and gate conductor G46E. This representation of the state of a stage is exactly analogous to the state representation in the circuit of FIG. 1. Cryotrons K52E, K52F, and K52G having control conductor C52E connected in series with control conductors C52F and C52G, are reset cryotrons, the functions of which will be understood as the description proceeds. It should also be noted that again a source of bias current $I_B$ is applied to each stage of the register, flowing through control conductors C40CG, C42AG, C40CF, C42AF, C40CE, and C42AE. Further, linking currents are employed for the transmittal of the information stored in a first stage to store this information in a second stage. A pair of these linking currents are employed, the first, indicated as $I_X$, linking stages E and F and, further linking current $I_X$ is additionally effective to link stage G with the next succeeding stage. A second linking current, $I_Y$, is shown linking stages F and G as well as linking stage E to the preceding stage or information register. Each of these linking currents flows through either one or another parallel path labelled 1 or 0. This designation has been employed as an aid in understanding the operation of the shift register to indicate that linking current flow through the one path is effective, upon application of a shift pulse, to transfer a 1 between stages and correspondingly linking current flow through the 0 path is effective, upon the application of the shift pulse, to transfer a 0 between the linked stages. Shift pulses are individually applied to stages E, F, and G along lines 56, 58 and 60 as indicated. It should be noted at this time, that these lines could be connected in series so that a single shift pulse is simultaneously applied to all of the stage of the shift register.

In the description of the operation of the shift register, it will initially be assumed that each of stages E, F, and G are in the 0 state and, further, that each of the linking currents $I_X$ and $I_Y$ are flowing along the 0 linking lines. The final assumption made is that prior to the first shift pulse being applied to stage E, linking current $I_Y$ flows along a line 54 to stage E, indicating a value of one stored in the preceding stage or register. Next, the application of a shift pulse along line 56 of stage E is effective to switch stage E to the 1 representation state. This occurs, since the shift current flows through control conductor C44BE and the $I_Y$ current along line 54, simultaneously flows through control conductor C44AE. These two currents are effective to form a vector sum of two units of current, which is thereafter effective to quench superconductivity in gate conductor G44E of cryotron K44E. This resistive gate conductor in the 0 representative path of stage E is effective to shift the main current of stage E into the superconducting 1 representative path. In a similar manner as that described above with reference to FIG. 1, upon termination of the shift pulse, gate conductor G42E of cryotron K42E switched to the resistive state. This is accomplished due to the absence of the shift register current flowing through control conductor C42CE and the simultaneous application of current flow through control conductor C42AE by bias current $I_B$ and the energization of control conductor C42BE through the application of current $I_E$. Thus the $I_X$ current between stages E and F is shifted into the 1 linking path which includes superconducting gate conductor G40E and control conductor C44AF of stage F. Thus upon termination of the shift pulse applied to line 56 of stage E, stage E is in the binary 1 state and stage F and stage E remain in the binary 0 state.

Thereafter, a second shift pulse applied to line 58 of stage F is effective to shift that stage to the binary 1 state. This shift is accomplished since the shift current applied to line 58 flows through control conductor C44BF, which together with the $I_X$ linking current flowing through C44AF, is sufficient to quench superconductivity in gate conductor G44F, thereby introducing resistance into the binary 0 path of stage F. This resistance then causes the main current of stage F to shift into the superconducting binary 1 path thereof including gate conductor G46F and control conductor C42BF. Simultaneously with the application of the shift pulse to line 58 of stage F, if the information indicated as flowing from the previous stage or register obtains a value of 0 at this time and a shift pulse is applied to stage E along 56, stage E is returned to the binary 0 state. This transfer is accomplished as a result of the current flow through control conductor C46AE of cryotron K46E together with the $I_Y$ current flowing through control conductor C46BE which together is effective to quench superconductivity in gate conductor G46E, thereby introducing resistance into the binary 1 path of stage E. This resistance directs the main stage current $I_E$ to shift into the binary 0 path, consisting of gate conductor C40BE and gate conductor G44E as stated previously. Upon the termination of these shift pulses the linking currents between stages E and F as well as stages F and G are shifted. This results since the removal of the shift current from line 58 of stage F deenergizes control conductor C42CF of cryotron K42F and at the time that control conductor C42BF is energized by the main stage current $I_F$ and control conductor C42AF is energized by the bias current $I_B$. These currents together are effective to quench superconductivity in control conductor G42F, and introduce resistance in the 0 linking stages F and G, thereby directing linking current $I_Y$ into the 1 linking path including gate conductor G40F and control conductor C44AG of stage G. In similar fashion, the termination of the shift pulse applied to line 56 of stage E deenergizes control conductor C40AE of cryotron K40E, while control conductor C40BE is energized by the main stage current $I_E$ and control conductor C40CE is energized by the bias current $I_B$. These currents together are effective to quench superconductivity in gate conductor G40E, thus introducing resistance in the one linking path between stage E and F. This resistance thereupon directs linking current $I_X$ into the 0 linking path which includes gate conductor G42E of stage E and control conductor C46BF of stage F. In a similar manner, a shift pulse applied to line 60 of stage G is effective to transfer this stage to the binary 1 state as a result of the $I_Y$ current flowing through control conductor C44AG of cryotron K44G, together with the shift current flowing through control conductor C44BG. In a similar fashion, a shift pulse simultaneously applied to line 58 of stage F is effective to return this stage to the 0 state, through the summation of the shift current flow through control conductor C46AF and the linking current flow through control conductor C46BF.

It is thus seen that information can be rippled through stage by stage of the shift register, and in accordance with the information entered into the initial stage of the register. Further, should it be desired to simultaneously return all of the stages to the binary 0 state, this is effected by applying a current to a line 62 connected in series with the control conductors of the reset cryotron in each stage. The application of this current is effective to shift the main stage current into the 0 representative path of each stage. This current flow in the 0 line, in the absence of any shift pulse being applied, is effective to return all the linking currents into the 0 linking path due to the main stage current in the 0 path together with the bias current flowing through a pair of control conductors of each stage.

Although each of the embodiments of the invention as shown must be operated at a superconductive temperature, which generally is in the vicinity of the temperature of liquid helium or approximately 4.2° K., neither the apparatus nor the method of obtaining such a temperature has been shown since this is well known to those skilled in the art and further is more particularly described in the hereinbefore referenced Buck patent, by way of example.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A superconductive logical circuit operable at a superconductive temperature comprising; first, second, third, and fourth multiple control cryotrons each including a gate conductor and a plurality of control conductors, means connecting the gate conductor of said first cryotron in series with a first control conductor of said second cryotron to define a first current path; means connecting the gate conductor of said fourth cryotron in series with a first control conductor of said third cryotron to define a second current path; means connecting said first and second current paths in parallel; means supplying a first current to said first and second paths; said first current when in said first path representative of a first stable state and said first current when in said second path representative of a second stable state; means connecting a first control conductor of said first cryotron in series with the gate conductor of said third cryotron to define a third current path; means connecting the gate conductor of said second cryotron in series with a first control conductor of said fourth cryotron to define a fourth current path; means connecting said third and fourth current paths in parallel; means supplying a second current to said third and fourth paths; means connecting a second control conductor of said second cryotron in series with a second control conductor of said third cryotron to define a fifth current path; means supplying a source of bias current to said fifth path; means connecting a second control conductor of each of said first and fourth cryotrons and a third control conductor of each of said second and third cryotrons in series to define a sixth current path; means selectively supplying pulses of trigger current to said sixth path; the gate conductor of all of said cryotrons being switchable to the resistive state at said superconductive temperature when the vector sum of energized control conductors associated therewith is at least two; and each of said trigger pulses effective when applied to said sixth path only to alter the state of said circuit and further effective when removed therefrom only to direct said second current to a predetermined one of said third and fourth paths determined solely by the state of said circuit.

2. A superconductive trigger circuit operable at a superconductive temperature comprising; first, second, third, and fourth cryotrons each including a superconductive gate conductor and a plurality of control conductors for applying magnetic fields thereto; each of said cryotrons requiring a unit value of current flow in the same direction simultaneously through at least two control conductors for quenching superconductivity in said gate conductor through the vector sum of magnetic fields generated thereby; means connecting said gate conductor of said first cryotron in series with a first control conductor of said second cryotron to define a first current path; means connecting a first control conductor of said third cryotron in series with said gate conductor of said fourth cryotron to define a second current path; means connecting a first control conductor of said first cryotron in series with said gate conductor of said third cryotron to define a third current path; means connecting said gate conductor of said second cryotron in series with a first control conductor of said fourth cryotron to define a fourth current path; means connecting a second control conductor of each of said first, second, third, and fourth cryotrons in series to define a fifth current path; means connecting a third control conductor of said second and third cryotrons in series to define a sixth current path; means supplying a bias current to said sixth path; means connecting said third and fourth paths in parallel and in series with an auxiliary current supply; means connecting said first and second paths in parallel and in series with a main current supply; current from said main supply flowing in said first path being effective in combination with said bias current flowing in said sixth path to render said fourth path resistive, and said main current flowing in said second path being further effective in combination with said bias current flowing in said sixth path to render said third path resistive; a source of trigger pulses coupled to said fifth path; any of said trigger pulses being effective in combination with said auxiliary current established in the superconducting one of said third and fourth paths to shift the main current between said first and second paths.

3. The trigger circuit of claim 2 wherein any of said trigger pulses is further effective to render each of said third and fourth paths superconducting.

4. A superconductive circuit comprising at least one main pair of parallel circuit paths connected to a current source for operation as a main bistable circuit in which current is carried in only one of said paths to manifest the state thereof, each of said circuit paths including a multiple control cryotron having its gate element connected in said path, multiple control windings for each of said cryotrons, one of said windings of each of said cryotrons being connected in a separate auxiliary circuit path, said auxiliary circuit paths being connected in parallel and to a current source and operable as an auxiliary bistable circuit in which current is carried in only one of said paths to manifest the state thereof and to determine the next state to be achieved by said main bistable circuit, another winding of each of said cryotrons being connected in a pulse circuit to a single source of current pulses, each of said cryotrons being operable to become resistive only in response to the concurrent presence of current in both of the associated control windings.

5. A superconductive circuit comprising at least one main pair of parallel circuit paths connected to a current source for operation as a main bistable circuit in which current is carried in only one of said paths to manifest the state thereof, each of said circuit paths including a multiple control cryotron having its gate element connected in said path, multiple control windings for each of said cryotrons, one of said windings of each of said cryotrons being connected in a separate auxiliary circuit path, said auxiliary circuit paths being connected in parallel and to a current source and operable as an auxiliary bistable circuit in which current is carried in only one of said paths to manifest the state thereof and to determine the next state to be achieved by said main bistable circuit, another winding of each of said croytrons being connected in a pulse circuit to a single source of current pulses, each of said cryotrons being operable to become resistive only in response to the concurrent presence of current in both of the associated control windings, each of said main circuit paths including a multiple control cryotron having a first control winding connected in series therein, each of said last-mentioned cryotrons having a second winding connected to said pulse circuit for conduction of current pulses in a direction to set up a magnetic field in opposition to the magnetic field due to the current in said first control winding to maintain said last-mentioned cryotrons in a superconductive condition during the current pulse period, each of said last-mentioned cryotrons being operable to become resistive in response to current in said first control winding after the termination of a current pulse in said second winding.

6. A superconductive circuit comprising at least one main pair of parallel circuit paths connected to a current source for operation as a main bistable circuit in which current is carried in only one of said paths to manifest the state thereof, each of said circuit paths including a multiple control croytron having its gate element connected in said path, multiple control windings for each of said cryotrons, one of said windings of each of said cryotrons being connected in a separate auxiliary circuit path, said auxiliary circuit paths being connected in parallel and to a current source and operable as an auxiliary bistable circuit in which current is carried in only one of said paths to manifest the state thereof and to determine the next state to be achieved by said main bistable circuit, another winding of each of said cryotrons being connected in a pulse circuit to a single source of current pulses, each of said cryotrons being operable to become resistive only in response to the concurrent presence of current in both of the associated control windings, each of said main circuit paths including a multiple control cryotron having a first control winding connected in series therein, each of said last-mentioned cryotrons having a second winding connected to said pulse circuit for conduction of current pulses in a direction to set up a magnetic field in opposition to the magnetic field due to the current in said first control winding, said last-mentioned cryotrons each including a third control winding connected to a source of bias current for current conduction in a direction which aids the magnetic field due to the current in said first winding, said second control windings being operable during conduction of a current pulse to maintain said last-mentioned cryotrons in a superconductive condition, each of said last-mentioned cryotrons being operable to become resistive in response to current in said first control winding in the presence of bias current in said third control winding after the termination of a current pulse in said second winding.

7. A superconductive trigger circuit comprising at least one main pair of parallel circuit paths connected to a current source for operation as a main bistable circuit in which current is carried in only one of said paths to manifest the state thereof, each of said circuit paths including a multiple control cryotron having its gate element connected in said path, multiple control windings for each of said cryotrons, one of said windings of each of said cryotrons being connected in a separate auxiliary circuit path, said auxiliary circuit paths being connected in parallel and to a current source and operable as an auxiliary bistable circuit in which current is carried in only one of said paths to manifest the state thereof, another winding of each of said cryotrons being connected in a pulse circuit and to a single source of current pulses, each of said cryotrons being operable to become resistive only in response to the concurrent presence of current in both of the associated control windings to thereby change the state of said main bistable circuit in response to the state of said auxiliary bistable circuit, each of said main circuit paths including a multiple control cryotron having a first control winding connected in series therein and having a gate element connected in series in the auxiliary circuit path including the control winding of the first-mentioned cryotron associated with the other main circuit path, each of said last-mentioned cryotrons having a second winding connected to said pulse circuit for conduction of current pulses in a direction to set up a magnetic field in opposition to the magnetic field due to the current in said first control winding, said last-mentioned cryotrons each including a third control winding connected to a source of bias current for current conduction in a direction which aids the magnetic field due to the current in said first winding, said second control windings being operable during conduction of a current pulse to maintain said last-mentioned cryotrons in a super-conductive condition, each of said last-mentioned cryotrons being operable to become resistive in response to current in said first control winding in the presence of bias current in said third control winding after the termination of a current pulse in said second winding to thereby change the state of said auxiliary bistable circuit in response to the state of said main bistable circuit.

8. A superconductive circuit comprising a plurality of main pairs of parallel circuit paths connected in cascaded fashion and each connected to a current source for operation as a main bistable circuit in which current is carried in only one of said paths to manifest the state thereof, each of said circuit paths of each pair including a multiple control cryotron having its gate element connected in said path, multiple control windings for each of said cryotrons, one of said windings of each of said crytrons being connected in a separate auxiliary circuit path, said auxiliary circuit paths being connected in parallel and to a current source and operable as an auxiliary bistable circuit for each of said main bistable circuits in which current is carried in only one of said paths to manifest the state thereof and to determine the next state to be achieved by said main bistable circuit, another winding of each of said cryotrons being connected in a pulse circuit for supplying to a single source of current pulses, each of said cryotrons being operable to become resistive only in response to the concurrent presence of current in both of the associated control windings to thereby change the state of said main bistable circuit in response to the state of said auxiliary bistable circuit, each of said main circuit paths including a multple control cryotron having a first control winding connected in series therein and having a gate element connected in series in one of said auxiliary circuit paths for the next succeeding bistable circuit, each of said last-mentioned cryotrons having a second winding connected to said pulse circuit for conduction of current pulses in a direction to set up a magnetic field in opposition to the magnetic field due to the current in said first control winding, said last-mentioned cryotrons each including a third control winding connected to a source of bias current for current conduction in a direction which aids the magnetic field due to the current in said first winding, said second control windings being operable during conduction of a current pulse to maintain said last-mentioned cryotrons in a superconductive condition, each of said last-mentioned cryotrons being operable to become resistive in response to current in said first control winding in the presence of bias current in said third control winding after the termination of a current pulse in said second winding to thereby change the state of the next succeeding auxiliary bistable circuit in response to the state of said main bistable circuit.

References Cited in the file of this patent

UNITED STATES PATENTS

| | | |
|---|---|---|
| 3,019,353 | Mackay | Jan. 30, 1962 |
| 3,021,439 | Anderson | Feb. 13, 1962 |
| 3,053,451 | Mackay | Sept. 11, 1962 |